United States Patent
Phipps

(10) Patent No.: US 7,087,183 B2
(45) Date of Patent: Aug. 8, 2006

(54) METHOD OF USING AN ETCHANT SOLUTION FOR REMOVING A THIN METALLIC LAYER

(75) Inventor: Peter Beverley Powell Phipps, Saratoga, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/165,728

(22) Filed: Jun. 24, 2005

(65) Prior Publication Data

US 2005/0236275 A1    Oct. 27, 2005

Related U.S. Application Data

(62) Division of application No. 10/319,257, filed on Dec. 13, 2002, now abandoned.

(51) Int. Cl.
*B44C 1/22* (2006.01)

(52) U.S. Cl. .................. 216/83; 216/100; 216/106; 216/108

(58) Field of Classification Search .............. 216/83, 216/100, 106, 108
See application file for complete search history.

(56) References Cited

U.S. PATENT DOCUMENTS

| | | | | |
|---|---|---|---|---|
| 4,596,760 A * | 6/1986 | Ballarini et al. | ......... | 430/278.1 |
| 5,041,191 A * | 8/1991 | Watson | ......... | 216/16 |
| 5,486,282 A * | 1/1996 | Datta et al. | ......... | 205/123 |
| 5,490,028 A | 2/1996 | Ang et al. | ......... | 360/126 |
| 5,673,163 A | 9/1997 | Cohen | ......... | 360/126 |
| 5,673,474 A | 10/1997 | Watterston et al. | ......... | 29/603.14 |
| 5,723,062 A * | 3/1998 | Covert et al. | ......... | 252/79.2 |
| 6,015,505 A * | 1/2000 | David et al. | ......... | 252/79.2 |
| 6,069,015 A | 5/2000 | Gray et al. | ......... | 438/3 |
| 6,118,629 A | 9/2000 | Huai et al. | ......... | 360/126 |
| 6,221,269 B1 * | 4/2001 | Sachdev et al. | ......... | 216/101 |
| 6,264,851 B1 | 7/2001 | Markovich et al. | ......... | 216/39 |
| 6,780,751 B1 * | 8/2004 | Fay | ......... | 438/613 |

FOREIGN PATENT DOCUMENTS

WO      WO 93/11532      6/1993

\* cited by examiner

*Primary Examiner*—Nadine Norton
*Assistant Examiner*—Binh X. Tran
(74) *Attorney, Agent, or Firm*—William D. Gill

(57) ABSTRACT

A method for removing a thin metallic layer using an etchant solution is provided for essentially eliminating undercutting in a thin metallic layer such as a seed layer in a magnetic recording head. The etchant solution has a suitable solvent additive such as glycerol or methyl cellulose. With suitable solvent additives, which generally increase solvent viscosity, lateral etching rates are similar to surface etch rates and undercutting is essentially eliminated.

10 Claims, 5 Drawing Sheets

METHOD OF USING AN ETCHANT SOLUTION FOR REMOVING A THIN METALLIC LAYER

This is a divisional application of Ser. No. 10/319,257 filed on Dec. 13, 2002 now abandoned.

BACKGROUND OF THE INVENTION

1. Field of the Invention

The invention relates to a method of removing a thin metallic layer during manufacture of thin film devices such as magnetic recording heads; and, specifically the invention relates to an etchant solution and method of use for removing a thin metallic layer.

2. Description of the Background Art

In many thin film devices a metal layer is formed on an insulating substrate by first depositing a thin metallic layer such as a conductive seed layer. A patterned layer of photoresist is then formed following by electrodeposition. Typically, the photoresist is removed and a second photoresist layer is formed which protects the desired portions of the electrodeposited material. An etchant is then used to remove exposed portions of the thin metallic layer.

An example is the fabrication of a thin film magnetic recording head. In this example, the magnetic poles of the inductive write head and the copper turns in the write head are created with the method outlined above.

Frame plating is typically used in the construction of electrodeposited structures. Briefly, after the deposition of a thin metallic layer, a first layer of photoresist is formed. The first layer of photoresist is thicker than the desired final electrodeposited feature and is formed as a frame of several microns surrounding the final desired features. The desired metal is electrodeposited through the patterned first layer of photoresist within the frame. The desired metal is also typically plated simultaneously outside the frame to form a field. By plating both the desired features within the frame and the field outside the frame, good uniformity and composition control of the electroplated features is achieved. The first layer of photoresist is then removed and a second layer of photoresist is formed and patterned to protect the desired electroplated features while simultaneously leaving the field material exposed to subsequent etching. An etchant solution is then used to remove the exposed thin metallic layer and the exposed field material. The lateral etch rate is subject to factors which are difficult to control such as film stress and varying surface energy of the interfaces. Consequently, conventional chemical etchants may exhibit greater lateral etching rates compared with etching normal to the thin metallic layer. The higher lateral etch rates may enable the etchant solution to attack the material under the protective photoresist resulting in undercutting. Due to the visual appearance, the damage due to high lateral etching rates is sometimes called rat bites. In severe cases of rat bites the chemical etchant may damage the protected electrodeposited material.

To solve these problems, a chemical etchant solution and method of use is needed which eliminates or greatly reduces the rat bite problem.

SUMMARY OF THE INVENTION

In a preferred embodiment, the invention provides a chemical etchant solution and method of use which effectively eliminates rat bite damage in thin metallic layers. One embodiment of the etchant solution includes ferric ammonium sulfate dissolved in a solvent including water and an additive which increases the viscosity of the etchant solution. Glycerol in a concentration from about 20% to about 50% effectively increases the viscosity. Alternatively, the etchant solution may include ferric ammonium sulfate dissolved in a solvent including water and methyl cellulose. In another embodiment of the invention, a method for removing a thin metallic layer is provided wherein the etchant solution includes ferric ammonium sulfate dissolved in a solvent including water and glycol, methyl cellulose, or a mixtures of these additives.

Other aspects and advantages of the invention will become apparent from the following detailed description, which, when taken in conjunction with the drawings, illustrate by way of example the principles of the invention.

DETAILED DESCRIPTION OF THE INVENTION

Figure 1A:
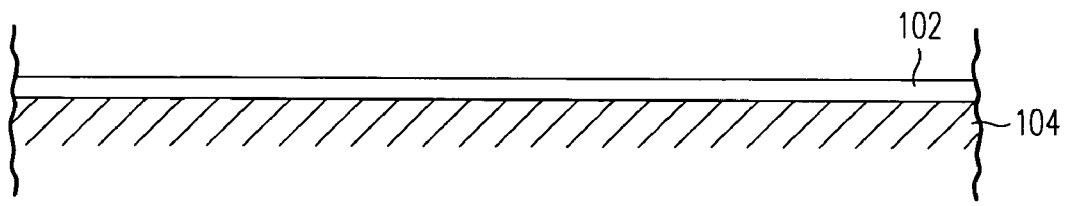
FIG. 1a illustrates a cross sectional view of a thin metallic layer as deposited on an insulating substrate.

The invention is embodied in a novel etchant solution which includes at least one additive which increases viscosity. The increase in viscosity virtually eliminates the undercutting known as rat bites in protected thin metallic films. The invention is also embodied in a method for using the novel etchant solution.

The features in the figures are not necessarily drawn to scale. For example, in a magnetic recording head the height of the upper pole of a write head is typically 3 to 4 times larger than the width. However, those skilled in the art will readily recognize the utility of the invention does not depend on the specific structures shown in the drawings.

Figure 1B:
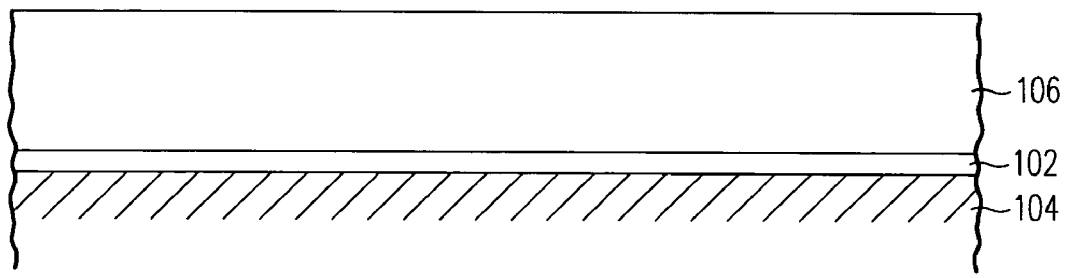
FIG. 1b illustrates a cross sectional view of a first layer of photoresist formed over the thin metallic layer.
Figure 1C:
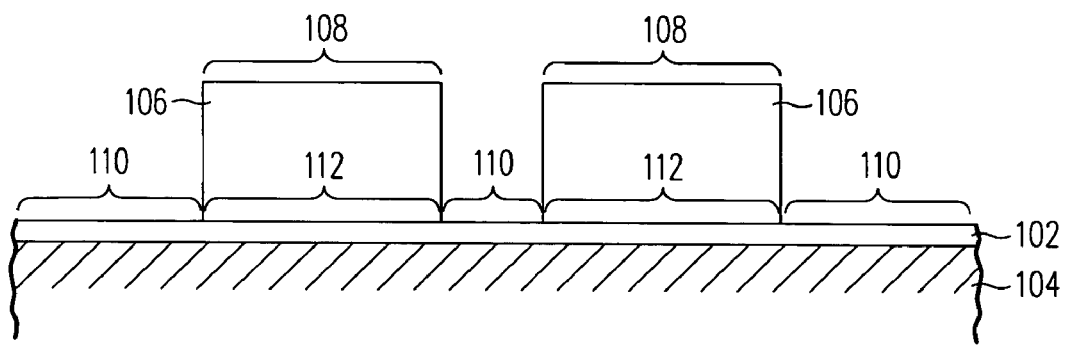
FIG. 1c illustrates a cross sectional view of the layer of photoresist after patterning.
Figure 1D:
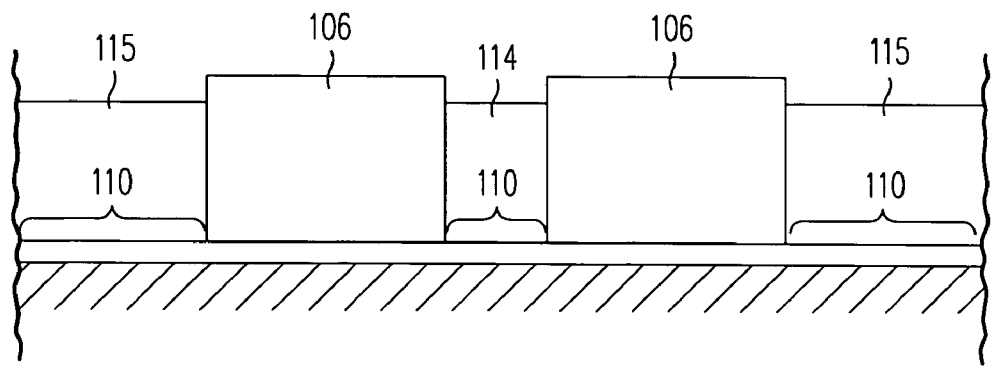
FIG. 1d illustrates a cross sectional view of the result of electrodepositing material on the exposed portions of the thin metallic layer.
Figure 1E:
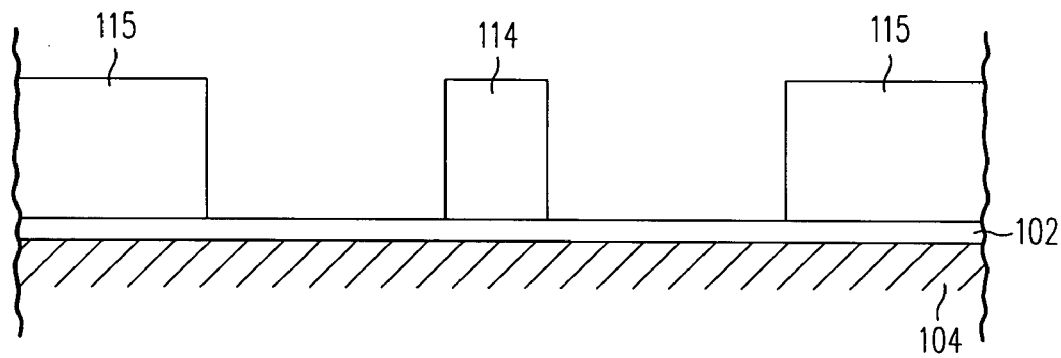
FIG. 1e illustrates a cross sectional view of the result of removing the first photoresist layer.
Figure 1F:
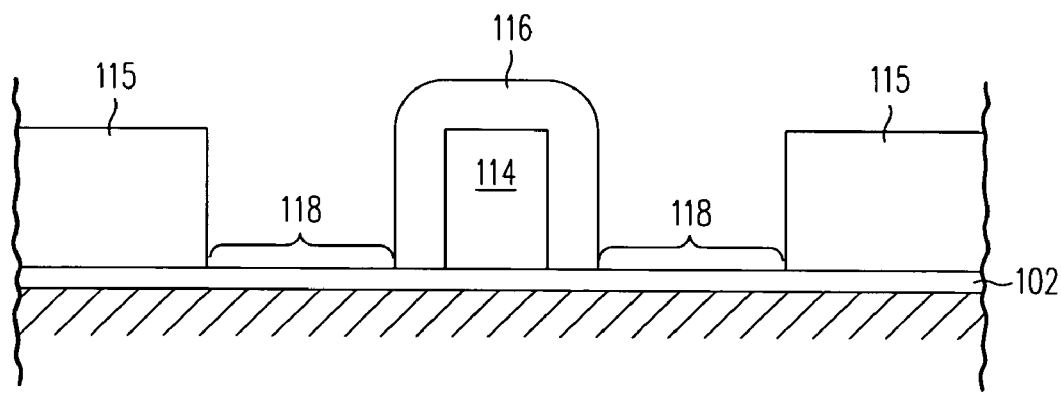
FIG. 1f illustrates a cross sectional view of the formation of a second layer of photoresist.

FIGS. 1a–f illustrate cross sectional views of the construction of layers leading to a thin film device such as a magnetic recording head. The method illustrated in FIGS. 1a–f are exemplary of using a thin metallic layer and may differ in some details according to specific implementations. FIG. 1a illustrates a thin metallic layer 102, such as a seed layer, as deposited on an insulating substrate 104. A nickel-iron alloy is commonly used as a seed layer in the construction of magnetic recording heads. Typically, the thickness of the thin metallic layer 102 is from about 500 A to about 2000 A. FIG. 1b illustrates a first layer 106 of photoresist formed over the thin metallic layer 102. FIG. 1c illustrates one or more portions 108 of the photo resist 106 remaining after patterning. One or more portions 110 of the thin metallic layer 102 not covered by the remaining photoresist 108 are exposed to an electrodeposition solution (not shown). The remaining patterned photoresist 108 covers protected portions 112 of the thin metallic layer 102. FIG. 1d illustrates the electrodeposited metal 114, 115 after deposition onto the exposed portions 110 of the thin metallic layer 102. The electrodeposited material indicated by reference 114 represents the desired features. The electrodepositied material indicated by reference 115 represents the field material. FIG. 1e illustrates the results of removing the first layer of photoresist (106 in FIG. 1d). FIG. 1f illustrates the results of applying a second layer 116 of photoresist. The second layer 116 of photoresist covers the electrodeposited features 114. The second layer 116 of photoresist exposes portions 118 of the underlying thin metallic layer 102 and also exposes the electrodeposited field material 115.

Figure 2A:
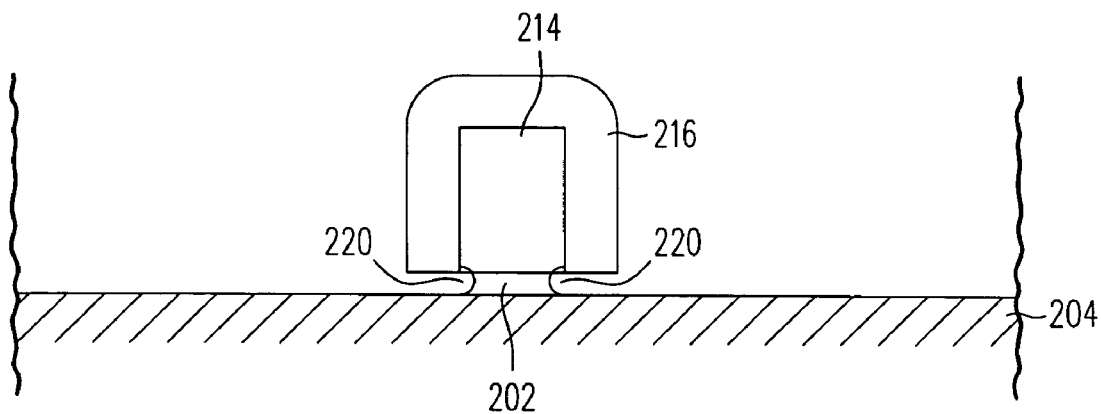
FIG. 2a illustrates a cross sectional view of the results of using the prior art chemical etchant to remove the exposed portions of the thin metallic layer.
Figure 2B:
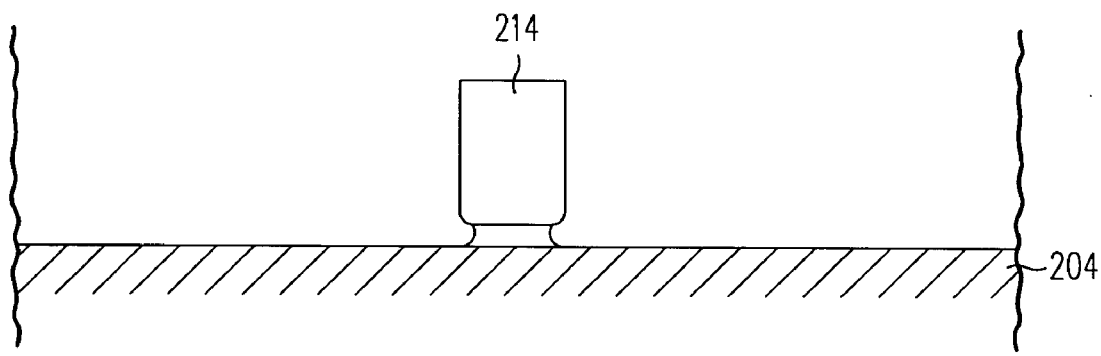
FIG. 2b illustrates a cross sectional view after removal of the second layer of photoresist of the results of using the prior art chemical etchant to remove the exposed portions of the thin metallic layer.

FIG. 2 illustrates the results of using a conventional chemical etchant solution (not shown) to remove the field material (115 in FIG. 1f) and exposed portions (118 in FIG. 1f) of the thin metallic layer 202. As illustrated in FIG. 2a, the exposed portions (118 in FIG. 1f) of the thin metallic layer 202 have been removed as desired. The field material (115 in FIG. 1f) has also been removed. The field material is substantially thicker than the thin metallic layer. Conventional chemical etchants must be present long enough to remove the field material. During this time, conventional chemical etchants tend to attack some of the thin metallic layer 202 which is covered with the second layer of photoresist 216 resulting in substantial undercutting. Undercutting resulting from conventional chemical etchants may be severe enough that some of the electroplated material (214 in FIG. 2a) is attacked. Undercut areas 220 are commonly referred to as rat bites. The presence of rat bites substantially changes the dimension of the underlying remaining metallic layer 202, and as a consequence there is poor dimensional control of the desired features. For example, the upper pole of a write element in a magnetic recording head is formed with the steps described above. Any etched alteration of the electroplated material results in a distortion of the write element geometry in the write gap region and results in a degraded magnetic performance. FIG. 2b illustrates the electroplated feature with etching damage after removal of the second layer of photoresist.

Figure 3A:
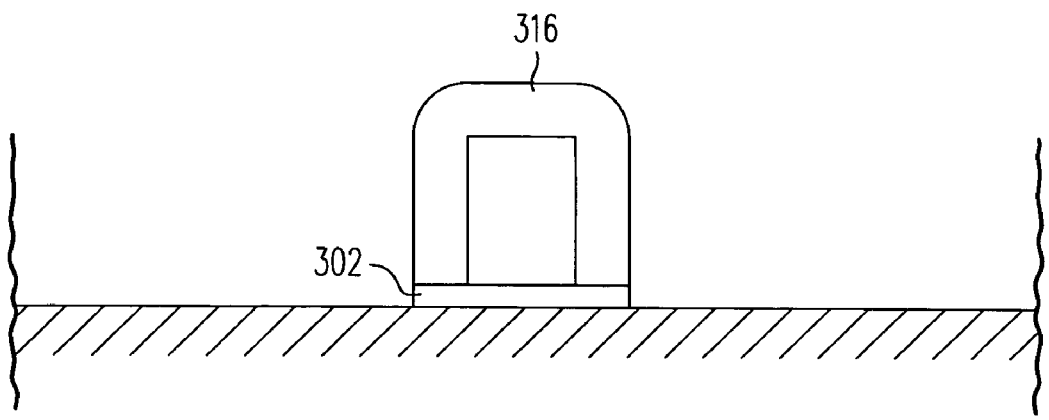
FIG. 3a illustrates a cross sectional view of the protected electrodeposited material after using an etchant solution according to the present invention.
Figure 3B:
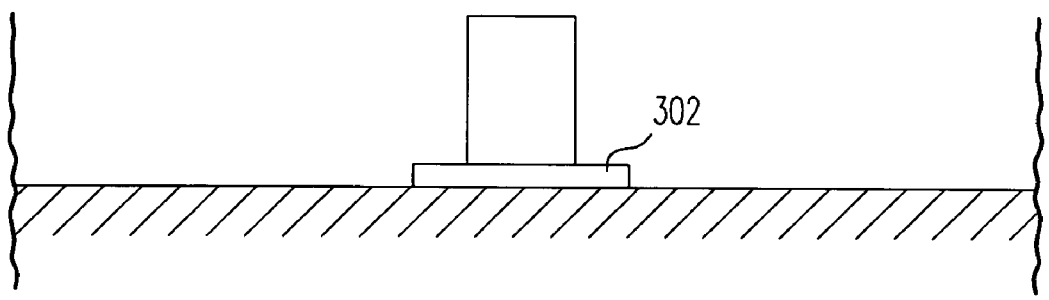
FIG. 3b illustrates a cross sectional view of the structure after removal of the second layer of photoresist.
Figure 3C:
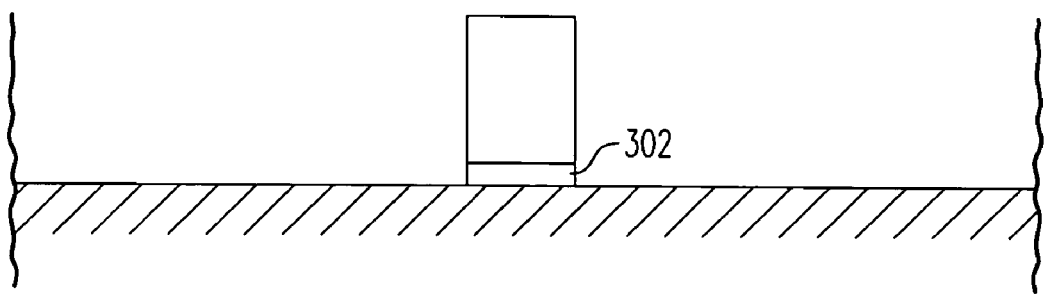
FIG. 3c illustrates a cross sectional view of the structure after an optional ion milling operation has been performed; and, FIG. 4 illustrates the method of using an etchant solution according to the present invention.

FIG. 3a illustrates the results of using the novel etchant solution (described in detail below) provided by the invention to remove the exposed portions of the thin metallic layer 302. The field material (115 in FIG. 1f) has been removed. In addition, there are no significant rat bites or undercutting when using the novel etchant solution. FIG. 3b illustrates the structure after removal of the second layer of photoresist (316 in FIG. 3a). FIG. 3c illustrates the results of using an optional brief ion milling operation to remove any remaining exposed portions of the thin metallic layer 302 after removal of the second layer of photoresist.

An aqueous solution of ferric alum (hydrated $FeNH_4(SO_4)_2$) is an effective etchant solution for alloys used in the manufacture of magnetic recording heads such as NiFe, CoFe, and NiFeCo. An effective composition of a ferric alum etchant solution is about 0.7 M (by ferric iron) adjusted to a pH value of about 1, typically with sulfuric acid. The effectiveness of the ferric alum etchant solution is not significantly altered if the concentrations change somewhat from the above mentioned values. During etching, the ferric ions are reduced to ferrous ions. However, the solution is easily rejuvenated by exposure to air which converts ferrous ions back to the ferric form. The principle disadvantage of using acidified ferric alum with a solvent of essentially water is that the lateral etching rate at the edges of a thin metallic layer can be over a hundred times faster than the etching rate normal to the surface of the thin metallic layer. This faster etching rate at the edges of the thin metallic layer contributes to the creation of rat bites. Other etchants were evaluated with respect to alleviating the occurrence of rat bites. Aqueous solutions of ammonium persulfate with a pH of approximately 1, ferric chloride in molar hydrochloric acid, and 0.7 molar ferric nitrate with a pH of about 1 were each demonstrated to be effective etchants. However each of these etchants also resulted in significant rat bites.

By adjusting the viscosity of the etchant solution, the lateral etching rate at the edges of a thin metallic layer may be significantly reduced compared with the etching rate normal to the surface. Thus, by appropriately adjusting the viscosity of the etchant solution, rat bites are essentially eliminated. Other physical mechanisms probably also come into play. For example, the solubility of the etch materials are possibly reduced in the novel etchant solution. Also photoresist adhesion and possibly swelling may be advantageously altered with the solvent additives. Viscosity is thus probably only one of several physical attributes of the novel solution which is advantageously altered.

A desirable viscosity range for an etchant solution is about 2 to 10 times that of water. A solvent additive which increases the viscosity of the solution from about 2 to 10 times that of a aqueous solution with no additives must be stable with respect to oxidation and low pH, and must not leave residue on the etched surfaces. Glycerol meets these criteria. Glycerol is not toxic, hazardous, volatile, or flammable. Glycerol is thus compatible with manufacturing environmental constraints. An etchant solution of ferric alum adjusted to a pH of about 1 in a solvent of water and glycerol essentially eliminates rat bites. Both the viscosity of water and the viscosity of a mixture of water and solvent additive are temperature dependent. However the ratio of the viscosity of water/additive to the viscosity of water is much less temperature dependent. Therefore viscosity is conveniently expressed as a ratio of solvent viscosity to water viscosity. The range of useful glycerol concentrations range from about 10% by weight to about 50% by weight. This range of concentrations result in a viscosity ratio range of about 2 to about 10. The etchant solutions having the higher concentrations of glycerol is effective, however the etching rate is somewhat slower. As with most etchant solutions, process uniformity is improved with vigorous stirring.

Alternative solvent additives are also effective in increasing etchant solution viscosity and reducing edge etching rates of a thin metallic layer. For example, methyl cellulose with a molecular weight of about 14,000 and a concentration of about 1% has been demonstrated to be effective as a solvent additive. Other cellulose polymers which in combination of molecular weight and concentration raise the viscosity to a factor of about 2 to about 10 times that of water likely effective. In general, glycols are likely effective. Generally, an etchant solution having a pH value of about 1 is preferable.

Other solvent additives which may increase solvent viscosity were considered, but do not meet the stability requirements and are not suitable. For example, polyvinyl alcohol increases etchant viscosity but forms a precipitate at low pH. Sucrose is not suitably stable enough for use in a predictable manufacturing process.

Figure 4:
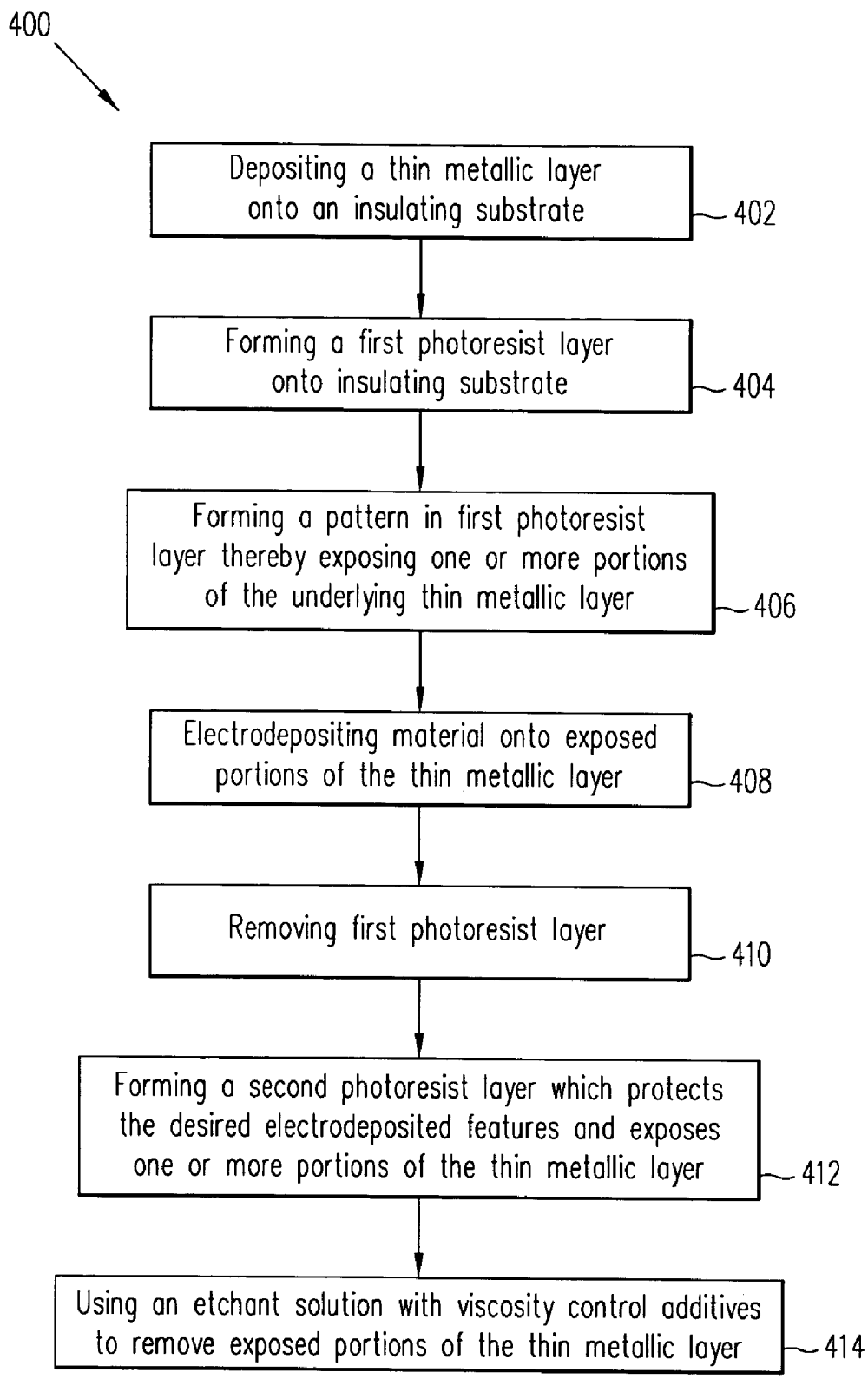

An exemplary method 400 of using the etchant solution provided by the invention is illustrated in FIG. 4. A thin metallic layer is deposited 402 on an insulating substrate. A first photoresist layer is formed 404 over the thin metallic layer. A pattern is formed 406 in the first photoresist layer which exposes one or more portions of the underlying thin metallic layer. The thin metallic layer is used as an electrical connection to allow the desired metal to be electrodeposited. The desired material is electrodeposited 408 onto the exposed portions of the thin metallic layer. The photoresist is removed 410 and a second layer of photoresist is formed 412 and patterned over the desired portions of the electrodeposited material. The second layer of photoresist exposes one or more portions of the thin metallic layer. An etchant solution provided by the invention is used 414 to remove the exposed portions of the thin metallic layer. The second photoresist is removed. Optionally, remaining exposed portions of the thin metallic layer may be removed with ion milling.

From the foregoing it will be appreciated that the etchant solution provided by the invention essentially eliminates rat bites in thin metallic layers commonly used as seed layers. Thus, the embodiments of the invention allow much better control of feature size and facilitate the construction of smaller feature sizes. Although specific embodiments of the invention have been described and illustrated, the invention is not to be limited to the specific forms or arrangements thus described. Those skilled in the art will recognize other embodiments which fall within the scope of the invention.

I claim:

1. A method for removing a thin metallic layer, comprising:
    depositing a thin metallic layer;
    forming a first photoresist layer over said thin metallic layer;
    forming a pattern in said first photoresist layer exposing a portion of said thin metallic layer;
    electrodepositing a material onto exposed portion of said thin metallic layer;
    removing said first photoresist layer;
    forming a second photoresist layer over desired electrodeposited material leaving an exposed portion of said thin metallic layer; and,
    using an etchant solution to remove said exposed portion of said thin metallic layer wherein said etchant solution includes ferric ammonium sulfate dissolved in a solvent including water and glycerol.

2. The method as in claim 1 wherein the concentration of said ferric ammonium sulfate is about 0.7 M ferric.

3. The method as in claim 1 wherein the etchant solution has a pH value of about 1.

4. The method as in claim 1 wherein said glycerol is about 10% to about 50% by weight of said solvent.

5. The method as in claim 1 wherein said solution has a viscosity of about 2 to 10 greater than water.

6. A method for removing a thin metallic layer, comprising:
    depositing a thin metallic layer;
    forming a first photoresist layer over said thin metallic layer;
    forming a pattern in said first photoresist layer exposing a portion of said thin metallic layer;
    electrodepositing a material onto exposed portion of said thin metallic layer;
    removing said first photoresist layer;
    forming a second photoresist layer over desired electrodeposited material leaving an exposed portion of said thin metallic layer; and,
    using an etchant solution to remove said exposed portion of said thin metallic layer wherein said etchant solution includes ferric ammonium sulfate dissolved in a solvent including water and methyl cellulose.

7. The method as in claim 6 wherein said methyl cellulose has a molecular weight of about 14,000.

8. The method as in claim 6 wherein the concentration of said methyl cellulose is about 1% by weight of solvent.

9. The method as in claim 6 wherein the etchant solution has a pH value of about 1.

10. The method as in claim 6 wherein said solution has a viscosity of about 2 to 10 greater than water.

* * * * *